United States Patent
Xu et al.

(10) Patent No.: US 11,015,082 B2
(45) Date of Patent: May 25, 2021

(54) CRACK-RESISTANT POLYSILOXANE DIELECTRIC PLANARIZING COMPOSITIONS, METHODS AND FILMS

(71) Applicant: Honeywell International Inc., Morris Plains, NJ (US)

(72) Inventors: Helen Xiao Xu, Sunnyvale, CA (US); Hong Min Huang, Shanghai (CN)

(73) Assignee: Honeywell International Inc., Charlotte, NC (US)

( * ) Notice: Subject to any disclaimer, the term of this patent is extended or adjusted under 35 U.S.C. 154(b) by 101 days.

(21) Appl. No.: 16/210,160

(22) Filed: Dec. 5, 2018

(65) Prior Publication Data

US 2019/0185709 A1    Jun. 20, 2019

Related U.S. Application Data (60) Provisional application No. 62/607,461, filed on Dec. 19, 2017.

(51) Int. Cl.
*C09D 183/10* (2006.01)
*C09D 7/63* (2018.01)
(Continued)

(52) U.S. Cl.
CPC ............. *C09D 183/10* (2013.01); *C09D 7/63* (2018.01); *C09D 7/80* (2018.01); *C09G 1/16* (2013.01);
(Continued)

(58) Field of Classification Search
None
See application file for complete search history.

(56) References Cited

U.S. PATENT DOCUMENTS 5,152,834 A * 10/1992 Allman .................. C08G 77/06
106/287.13
5,286,572 A * 2/1994 Clodgo ............... H01L 21/3122
428/447
(Continued)

FOREIGN PATENT DOCUMENTS

CN        104262628 B      8/2016
CN        106062042 A     10/2016
(Continued)

OTHER PUBLICATIONS

International Search Report and Written Opinion for PCT Patent Application No. PCT/US2018/066217, dated Apr. 5, 2019, 9 pages.

*Primary Examiner* — Robert S Loewe
(74) *Attorney, Agent, or Firm* — Faegre Drinker Biddle & Reath LLP

(57) ABSTRACT

A composition for planarizing a semiconductor device surface includes a catalyst, at least one solvent, and at least one polysiloxane resin including polysilsesquioxane blocks and polydisiloxane blocks. The polydisiloxane blocks are according to the general formula:

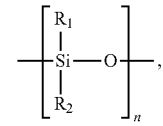

wherein $R_1$, $R_2$ are each independently selected from the group consisting of: an aryl group or an alkyl group, with substituted or unsubstituted carbons.

13 Claims, 3 Drawing Sheets

(51) Int. Cl.
H01L 21/3105 (2006.01)
C09D 7/80 (2018.01)
C09G 1/16 (2006.01)
C08K 5/19 (2006.01)

(52) U.S. Cl.
CPC .......... H01L 21/31051 (2013.01); *C08K 5/19* (2013.01)

(56) References Cited

U.S. PATENT DOCUMENTS

| | | | | |
|---|---|---|---|---|
| 5,412,053 | A * | 5/1995 | Lichtenhan | C08G 77/04 528/25 |
| 5,840,821 | A * | 11/1998 | Nakano | G01N 24/08 438/778 |
| 5,858,280 | A * | 1/1999 | Zhang | B01J 13/00 106/287.14 |
| 6,251,486 | B1 | 6/2001 | Chandross et al. | |
| 6,410,151 | B1 * | 6/2002 | Kurosawa | H01L 21/02216 428/447 |
| 6,503,633 | B2 * | 1/2003 | Nishikawa | H01L 21/02216 428/447 |
| 7,820,769 | B2 | 10/2010 | Seifalian et al. | |
| 8,299,185 | B2 * | 10/2012 | Saito | C07F 7/21 525/477 |
| 8,901,268 | B2 | 12/2014 | Krishnamoorthy et al. | |
| 10,118,879 | B1 | 11/2018 | Jungong et al. | |
| 2002/0189495 | A1 * | 12/2002 | Hayashi | C09D 183/14 106/287.13 |
| 2004/0028915 | A1 * | 2/2004 | Shibuya | H01L 21/02216 428/447 |
| 2005/0003681 | A1 * | 1/2005 | Lyu | C08G 77/50 438/781 |
| 2005/0090570 | A1 * | 4/2005 | Lyu | H01L 21/31695 521/50.5 |
| 2006/0134441 | A1 * | 6/2006 | Mah | H01L 21/02282 428/447 |
| 2006/0159938 | A1 * | 7/2006 | Lee | C08G 77/50 428/447 |
| 2006/0204192 | A1 * | 9/2006 | Satake | C08G 77/38 385/123 |
| 2007/0051947 | A1 * | 3/2007 | Nakayama | H01L 51/0074 257/40 |
| 2009/0076204 | A1 * | 3/2009 | Inabe | C08K 5/5419 524/261 |
| 2009/0225640 | A1 | 9/2009 | Manabe et al. | |
| 2010/0273937 | A1 * | 10/2010 | Tajima | C07F 7/21 524/588 |
| 2011/0171447 | A1 | 7/2011 | Krishnamoorthy et al. | |
| 2011/0201827 | A1 | 8/2011 | Lichtenhan et al. | |
| 2012/0277372 | A1 * | 11/2012 | Hu | C08G 77/04 524/588 |
| 2013/0210202 | A1 | 8/2013 | Kong et al. | |
| 2015/0031841 | A1 * | 1/2015 | Horstman | C08G 77/44 525/477 |
| 2015/0087771 | A1 * | 3/2015 | Horstman | C09D 183/10 524/588 |
| 2015/0087772 | A1 * | 3/2015 | Horstman | C09D 183/10 524/588 |
| 2017/0260419 | A1 | 9/2017 | Iwamoto et al. | |
| 2017/0306201 | A1 * | 10/2017 | Amako | C09J 183/10 |
| 2018/0009984 | A1 * | 1/2018 | Mizunashi | C08G 77/06 |
| 2020/0048416 | A1 * | 2/2020 | Furukawa | A61Q 19/00 |

FOREIGN PATENT DOCUMENTS

| | | |
|---|---|---|
| JP | 2015155541 A | 8/2015 |
| KR | 2011074677 A | 7/2011 |
| WO | 20161167892 A1 | 10/2016 |
| WO | 2017/145808 A1 | 8/2017 |

\* cited by examiner

CRACK-RESISTANT POLYSILOXANE DIELECTRIC PLANARIZING COMPOSITIONS, METHODS AND FILMS

CROSS-REFERENCE TO RELATED APPLICATION

This application claims priority to U.S. Provisional Application No. 62/607,461, filed Dec. 19, 2017, which is herein incorporated by reference in its entirety.

FIELD

The present invention relates to planarizing materials, and in particular, to planarizing dielectric materials for semiconductor and display manufacturing.

BACKGROUND

In advanced semiconductor manufacturing, for example microprocessors, memory devices, and displays employing light emitting diodes, there is a need for dielectric materials which can be spin-coated onto a surface of a device to fill deep spaces or gaps between device structures to provide a relatively planar surface suitable for subsequent device layer processing.

Improvements in planarizing dielectric materials are desired to provide planarization for advanced semiconductor devices having trenches six microns deep or deeper. It is advantageous that such dielectric materials be crack resistant at such thicknesses, even when exposed to temperatures in excess of 400° C. It is also important for optoelectronic applications that such dielectric materials have a high optical transmittance. The dielectric materials should also be thermally stable when exposed to temperatures exceeding 400° C.

SUMMARY

A composition for planarizing a semiconductor device surface includes a catalyst, at least one solvent, and at least one polysiloxane resin including polysilsesquioxane blocks and polydisiloxane blocks. The polydisiloxane blocks are according to the general formula:

wherein $R_1$, $R_2$ are each independently selected from the group consisting of: an aryl group or an alkyl group, with substituted or unsubstituted carbons.

Various embodiments concern a composition for planarizing a semiconductor device. The composition includes a catalyst, at least one solvent, and at least one polysiloxane resin including polysilsesquioxane blocks and polydisiloxane blocks. The polydisiloxane blocks are according to the general formula:

wherein $R_1$, $R_2$ are each independently selected from the group consisting of: an aryl group or an alkyl group, with substituted or unsubstituted carbons. In some embodiments, the polydisiloxane blocks include at least one of: poly(diphenylsiloxane) blocks, poly(phenylmethylsiloxane) blocks, and poly(dimethylsiloxane) blocks. In some particular embodiments, the polydisiloxane blocks consist of poly(diphenylsiloxane) blocks and poly(phenylmethylsiloxane) blocks. In some other embodiments, the polydisiloxane blocks consist of poly(dimethylsiloxane) blocks. In some embodiments, the polysilsesquioxane blocks include at least one of: poly(methylsilsesquioxane) blocks and poly(phenylsilsesquioxane) blocks. In some embodiments, a concentration of the polydisiloxane blocks is from 0.1 mole percent to 50 mole percent of the polysiloxane resin. In some embodiments, a weight average molecular weight of the polydisiloxane blocks in the composition is from 100 Da to 5,000 Da. In some embodiments, the at least one solvent includes at least one of: ethyl lactate, propylene glycol propyl ether, propylene glycol monomethyl ether acetate, ethanol, isopropyl alcohol, and n-butyl acetate. In some embodiments, the catalyst includes at least one of: tetramethylammonium acetate, tetramethylammonium hydroxide, tetrabutylammonium acetate, cetyltrimethylammonium acetate, and tetramethylammonium nitrate. In some embodiments, the composition further includes a surfactant. In some embodiments, the composition further includes a cross-linker. In some embodiments, the at least one polysiloxane resin includes a first polysiloxane resin and a second polysiloxane resin. In some embodiments, the at least one polysiloxane resin is a first polysiloxane resin, and further including a second polysiloxane resin, the second polysiloxane resin consisting of a poly(silsesquioxane) resin.

Various embodiments concern a method for making a planarizing composition. The method includes dissolving at least one polysiloxane resin in one or more solvents to form a resin solution and adding a catalyst to the resin solution. The at least one polysiloxane resin includes polysilsesquioxane blocks and polydisiloxane blocks. The polydisiloxane blocks are according to the general formula:

wherein $R_1$, $R_2$ are each independently selected from the group consisting of: an aryl group or an alkyl group, with substituted or unsubstituted carbons. In some embodiments, the polydisiloxane blocks include at least one of: poly(diphenylsiloxane) blocks, poly(phenylmethylsiloxane) blocks, and poly(dimethylsiloxane) blocks. In some embodiments, a concentration of the polydisiloxane blocks is from 0.1 mole percent to 50 mole percent of the polysiloxane resin.

Various embodiments concern a planarizing film for a semiconductor device. The planarizing film includes a catalyst residue and a cured polysiloxane. The cured polysiloxane includes polysilsesquioxane blocks and polydisiloxane blocks. The polydisiloxane blocks are according to the general formula:

$$\left[\begin{array}{c} R_1 \\ | \\ Si-O \\ | \\ R_2 \end{array}\right]_n,$$

wherein $R_1$, $R_2$ are each independently selected from the group consisting of: an aryl group or an alkyl group, with substituted or unsubstituted carbons. In some embodiments, the polydisiloxane blocks include at least one of: poly(diphenylsiloxane) blocks, poly(phenylmethylsiloxane) blocks, and poly(dimethylsiloxane) blocks. In some embodiments, a weight average molecular weight of the polydisiloxane blocks is from 100 Da to 5,000 Da. In some embodiments, a concentration of the polydisiloxane blocks is from 0.1 mole percent to 50 mole percent of the polysiloxane resin.

The above mentioned and other features of the invention, and the manner of attaining them, will become more apparent and the invention itself will be better understood by reference to the following description of embodiments of the invention taken in conjunction with the accompanying drawings.

DETAILED DESCRIPTION

Embodiments of the disclosure can employ a composition including a polysiloxane resin including polysilsesquioxane blocks and polydisiloxane blocks as described below for coating onto a surface of a semiconductor device, such as a microprocessor, a memory device, and a display employing light emitting diodes or other types of displays, to planarize the semiconductor device surface. The coating can be applied, for example, by spin-coating or slot coating. Planarizing films formed by curing compositions according to embodiments of this disclosure have been found to exhibit excellent crack-resistance at thicknesses greater than 7 microns, even when subjected to temperatures in excess of 400° C. Planarizing films formed by curing compositions according to some embodiments of this disclosure have been found to exhibit excellent crack-resistance at thicknesses greater than 10 microns, even when subjected to a temperature of 380° C. The planarizing films formed by curing compositions according to embodiments of this disclosure have also been found to exhibit high hardness and high optical transmittance. The planarizing films formed by curing compositions according to embodiments of this disclosure have also been found to be thermally stable when exposed to a temperature of 360° C. for 24 hours.

Figure 1:
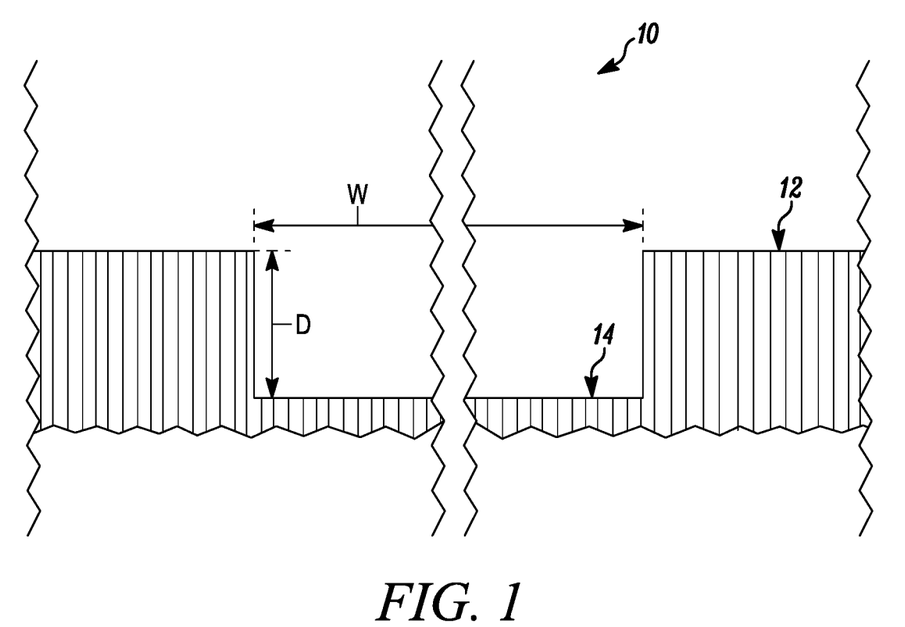
FIG. 1 is a schematic cross-section of a portion of a semiconductor device illustrating surface topography to be planarized.

FIG. 1 is a schematic cross-section of a portion of a semiconductor device illustrating surface topography to be planarized. FIG. 1 shows a semiconductor device 10 including a substrate 12 and at least one surface feature 14. The substrate 12 can include, for example, silicon, silicon dioxide, silicon nitride, aluminum, copper, or any other materials in various layers of various thicknesses and arrangements for the semiconductor device 10 as desired. In some embodiments, the surface feature 14 can be a trench formed into the substrate 12.

The surface feature 14 can be described as having a width W and a depth D. In some embodiments, the depth D of the surface feature 14 can be as small as 0.01 microns, 0.1 microns, 0.5 microns, or 1 micron, as large as 3 microns, 5 microns, 10 microns, 100 microns. In some embodiments, the depth D of the surface feature 14 can range from 0.01 microns to 100 microns, 0.1 microns to 10 microns, 0.5 microns to 5 microns, or 1 micron to 3 microns. In some embodiments, width W of the surface feature 14 can be as small as 0.01 microns, 0.1 microns, 1 micron, 10 microns, or as great as 50 microns, 100 microns, 500 microns, 1000 microns. In some embodiments, the width W of the surface feature 14 can range from 0.01 microns to 1000 microns, 0.1 microns to 500 microns, 1 micron to 100 microns, or 10 microns to 50 microns.

Figure 2:
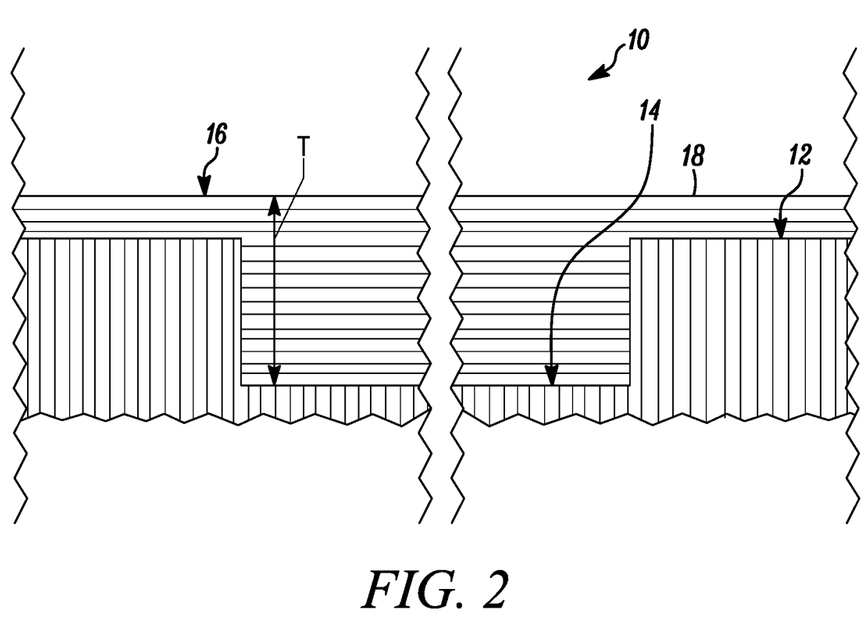
FIG. 2 is a schematic cross-section of the portion of the semiconductor device of FIG. 1 illustrating planarization of the surface topography by a planarization film according to embodiments of this disclosure.

FIG. 2 is a schematic cross-section of the portion of the semiconductor device 10 of FIG. 1 illustrating planarization of the surface feature 14 by a planarizing film 16 according to embodiments of this disclosure. FIG. 2 shows the semiconductor device 10 after formation of the planarizing film 16 from a composition including a polysiloxane resin according to embodiments of this disclosure. The planarizing film 16 can fill the surface feature 14 to provide a substantially planar surface 18 upon which subsequent devices layers (not shown) may be formed. In some embodiments, the planarizing film 16 can have a thickness T over a portion of the semiconductor device 10 that is greater than 6 microns. In some embodiments, the planarizing film 16 can have a thickness T over a portion of the semiconductor device 10 that is greater than 10 microns.

FIGS. 1 and 2 illustrate one example in which the planarizing film 16 according to embodiments of the disclosure may be formed. It is understood that the planarizing film 16 according to embodiments of the disclosure may be formed on many other topographies involving different arrangements of conductive, non-conductive, and semi-conductive materials. For ease of illustration, only one surface feature 14 is shown in FIGS. 1 and 2. However it is understood that embodiments can include a plurality of surface features 14.

The planarizing film 16 can be formed by coating at least a portion of the semiconductor device 10 by, for example, spin coating or slot coating a composition including at least one solvent, a catalyst, and a polysiloxane resin as described below. In some embodiments, the composition can further include a surfactant. In some embodiments, the composition can further include a cross-linker. In some embodiments, the composition consists essentially of a composition including at least one solvent, a catalyst, a surfactant, and at least one polysiloxane resin as described below. In some embodiments, the composition consists essentially of a composition including at least one solvent, a catalyst, a surfactant, a cross-linker, and at least one polysiloxane resin as described below.

In some embodiments, the polysiloxane resin can include polysilsesquioxane blocks and polydisiloxane blocks. The polysilsesquioxane blocks can include any type of polysilsesquioxane with the formula $[RSiO_{3/2}]_n$, wherein R is a hydrogen, an alkyl group, an aryl group, or an alkoxyl group. For example, in some embodiments, the polysilsesquioxane blocks can include poly(methylsilsesquioxane) blocks, poly (phenylsilsesquioxane) blocks, poly(methylphenylsilsesquioxane), or any combinations thereof.

The polydisiloxane blocks are according to the formula:
Formula I:

wherein $R_1$, $R_2$ are each independently selected from the group consisting of: an aryl group or an alkyl group, with substituted or unsubstituted carbons.

For example, in some embodiments, the polydisiloxane blocks can include poly(diphenylsiloxane) blocks in which $R_1$ and $R_2$ are each phenyl groups. In some embodiments, the polydisiloxane blocks can include poly(dimethylsiloxane) blocks in which $R_1$ and $R_2$ are each methyl groups. In some embodiments, the polydisiloxane blocks can include poly(phenylmethylsiloxane) blocks in which $R_1$ is a phenyl group and $R_2$ is a methyl group.

In some embodiments, the polysiloxane resin can include a single type of polydisiloxane block. For example, in some embodiments, the polydisiloxane blocks consist of poly(dimethylsiloxane) blocks, such as in SST-3PM2 dimethylsiloxane copolymer resin available from Gelest Inc., Morrisville, Pa. In other embodiments, the polysiloxane resin can include more than one type of polydisiloxane block. For example, in some embodiments, the polydisiloxane blocks can include any combination of poly(diphenylsiloxane) blocks, poly(dimethylsiloxane) blocks, or poly(phenylmethylsiloxane) blocks. In some embodiments, the polydisiloxane blocks can consist of poly(diphenylsiloxane) blocks and poly(phenylmethylsiloxane) blocks, such as in SST-3PM4 tetrapolymer resin available from Gelest Inc., Morrisville, Pa. In some other embodiments, the polydisiloxane blocks can consist of poly(diphenylsiloxane) blocks, poly(dimethylsiloxane) blocks, and poly(phenylmethylsiloxane) blocks.

The polydisiloxane blocks in the polysiloxane resin can have a weight average molecular weight (Mw). In some embodiments, weight average molecular weight (Mw) of the polydisiloxane blocks in the composition is as low as 100 Da, 200 Da, 500 Da, 800 Da, 1,000 Da, or 1,200 Da or as high as 1,600 Da, 2,100 Da, 2,600 Da, 3,400 Da, 4,300 Da, or 5,000 Da, or within any range defined by any two of the preceding values. For example, in some embodiments, the Mw of the polydisiloxane blocks in the composition ranges from 100 Da to 5,000 Da, 200 Da to 4,300 Da, 1,000 Da to 2,100 Da, 1,200 DA to 4,300 Da, or 1,200 Da to 1,600 Da. In some embodiments, the Mw of the polydisiloxane blocks in the composition is about 1,300 Da. The Mw can be measured by gel permeation chromatography, as is known in the art.

In some embodiments, a concentration of the polydisiloxane blocks in the polysiloxane resin can be as low as 0.1 mole percent (mol %), 1 mol %, 10 mol %, or 20 mol % or as high as 25 mol %, 30 mol %, 35 mol %, 40 mol %, or 50 mol % of the polysiloxane resin, or within any range defined by any two of the preceding values, for example, in some embodiments, the concentration of the polydisiloxane blocks in the composition can range from 0.1 mol % to 50 mol %, 1 mol % to 45 mol %, 10 mol % to 40 mol %, or 20 mol % to 30 mol % of the polysiloxane resin.

Without wishing to be bound by any theories, it is believed that the flexibility provided by the long polydisiloxane blocks in the polysiloxane resin described herein provide stress relief between the relatively rigid polysilsesquioxane blocks. The use of polydisiloxane blocks provides additional flexibility by limiting the opportunities for cross-linking of the polymer resin, as compared to, for example a polytrisiloxane or polytetrasiloxane blocks. It is further believed that films without such stress relief are more likely to crack due to the build-up of high stresses in the film. Thus, planarizing films formed from compositions according to embodiments of this disclosure are able to resist cracking, even at thickness exceeding 7 microns and after exposure to temperatures exceeding 400° C.

In some embodiments, the at least one polysiloxane resin can consist of any one of the polysilicon resins described above. In other embodiments, the at least one polysiloxane resin can include a first polysiloxane resin and a second polysiloxane resin that is different from the first polysiloxane resin. In some embodiments, the first polysiloxane resin and the second polysiloxane resin are each one of the polysiloxane resins described above. In other embodiments, the first polysiloxane resin can be one of the polysiloxane resins described above, and the second polysiloxane resin can be a poly(silsesquioxane) resin that is not one of the polysiloxane resins described above, for example, poly(phenyl-methyl silsesquioxane) resin.

The at least one solvent can include a single solvent, such as a glycol ether, a glycol ether acetate, n-butyl acetate, a ketone, or an alcohol. Glycol ethers can include, for example, propylene glycol propyl ether or propylene glycol methyl ether. Glycol ether acetates can include, for example, propylene glycol methyl ether acetate (PGMEA), 2-ethoxyethyl acetate, or 2-methoxyethyl acetate. Ketones can include, for example, acetone or diethyl ketone. Alcohols can include, for example, isopropyl alcohol, butanol, or ethanol. In other embodiments, the at least one solvent includes a mixture two or more of the foregoing solvents.

The catalyst can include, for example, tetramethylammonium acetate (TMAA), tetramethylammonium hydroxide (TMAH), tetrabutylammonium acetate (TBAA), cetyltrimethylammonium acetate (CTAA), tetramethylammonium nitrate (TMAN), triphenylamine, trioctylamine, tridodecylamine, triethanolamine, tetramethylphosphonium acetate, tetramethylphosphonium hydroxide, triphenylphosphine, trimethylphosphine, trioctylphosphine, aminopropyltriethoxysilane, aminopropyltriethoxysilane triflate, and any combinations thereof. Such catalysts can be activated by heat after the composition is applied to the semiconductor device 10 to cause polymerization and cross-linking of the composition to form the planarizing film 16.

In some embodiments, the composition can further include a surfactant. It has been found that a surfactant can further reduce striations, which may be particularly useful when the composition is spin-coated onto larger diameter semiconductor device wafers or display substrates. In some embodiments, the surfactant can be a polyether-modified polydimethylsiloxane surfactant, such a BYK®-306 or BYK®-307 available from BYK-Chemie, Wesel, Germany.

In some embodiments, the concentration of the surfactant in the composition can be as low as 0.01 wt. %, 0.1 wt. %, 0.4 wt. %, 0.6 wt. %, or 0.8 wt. %, or as high as 1 wt. %, 5 wt. %, 10 wt. %, 15 wt. %, or 20 wt. % of the total weight of the composition, or within any range defined by any two of the preceding values, for example, in some embodiments, the concentration of the surfactant in the composition can range from 0.01 wt. % to 20 wt. %, 0.1 wt. % to 15 wt. %, 0.4 wt. % to 10 wt. %, 0.6 wt. % to 5 wt. %, or 0.8 wt. % to 1 wt. % of the total weight of the composition.

In some embodiments, the composition can further include an organic acid which can volatilize or decompose at high temperatures to help stabilize the composition. In some embodiments, the organic acid can include trifluoroacetic acid, p-toluenesulfonic acid, citric acid, formic acid, or acetic acid, or any combinations thereof. In some embodiments, the concentration of the organic acid can include as little as 0.01 wt. %, 0.1 wt. %, 0.2 wt. %, or 0.4 wt. %, or as much as 0.5 wt. %, 0.6 wt. %, 0.8 wt. %, or 1 wt. % of the total weight of the composition, or within any range defined by any two of the preceding values, for example, in some embodiments, the concentration of the organic acid in the composition can range from 0.01 wt. % to 1 wt. %, 0.1 wt. % to 0.8 wt. %, 0.3 wt. % to 0.6 wt. %, or 0.4 wt. % to 0.5 wt. % of the total weight of the composition.

In some embodiments, the composition can further include a cross-linker. Cross-linkers form bonds in the polysiloxane resin. Without wishing to be bound by any theory, it is believed that the bonds provided by the cross-linker provide additional structure and strength to the planarizing film 16, providing additional crack resistance. In some embodiments, the cross-linker can include bis-(trimethoxysilylpropyl) amine, 1,3 bis(triethoxysilyl) benzene, 1,4 bis(triethoxysilyl) benzene, 2,6-bis(triethoxysilyl)-naphthalene, 9,10-bis(triethoxysilyl)-anthracene, 1,6-bis(trimethoxysilyl)-pyrene, bis(triethoxysilyl) methane, 1,2-bis(triethoxysily) ethane, or 1-(triethoxysilyl)-2-(diethoxymethylsilyl) ethane, or any combination thereof.

A method for making a planarizing composition in accordance with embodiments of this disclosure can include providing at least one polysiloxane resin as described above and dissolving the polysiloxane resin in the one or more solvents to form a resin solution. Dissolving the polysiloxane resin can be encouraged by mixing the polysiloxane resin into the one or more solvents for one to four hours. A catalyst as described above can be added to the resin solution. In some embodiments, a surfactant as described above can also be added to the resin solution. The resin solution can be stirred for several more hours, for example, three hours to form the composition. The composition may then be filtered through a 0.1 micron filter.

In use, a planarizing composition in accordance with embodiments of this disclosure can be applied to the semiconductor device 10 (FIG. 1) by, for example spin coating. The coated semiconductor device 10 can then be bake at a temperature ranging from about 160° C. to about 180° C. to drive off substantially all of the at least one solvent and form an uncured film. In some embodiments, once the at least one solvent is substantially driven off, a second coating of the planarizing composition can be applied on the uncured film and the coated semiconductor device 10 baked again at a temperature ranging from about 160° C. to about 180° C. to drive off substantially all of the at least one solvent and form a second layer of uncured film. The coating and backing processes can be completed until a desired thickness of uncured film is realized, after which the catalyst can be activated by heat to cure the film by polymerizing and cross-linking the polysiloxane resin to form the planarizing film 16. Residues of the catalyst can remain after curing.

In some embodiments, the planarizing film 16 can be cured at a temperature as low as 250° C., 260° C., 280° C., 300° C., or 350° C., or as high as 400° C., 410° C., 420° C., 430° C., 440° C., or 450° C., or at any temperature between any two of the preceding temperatures. For example, in some embodiments, the planarizing film 16 can be cured a temperature ranging from 250° C. to 450° C., 260° C. to 440° C., 280° C. to 430° C., 300° C. to 420° C., or 350° C. to 410° C.

In some embodiments, the planarizing film 16 can further include a surfactant residue, according to any of the embodiments described above, including a residue of a polyether-modified polydimethylsiloxane surfactant, such a BYK®-307.

While this invention has been described as relative to exemplary designs, the present invention may be further modified within the spirit and scope of this disclosure. Further, this application is intended to cover such departures from the present disclosure as come within known or customary practice in the art to which this invention pertains.

EXAMPLES

Example 1

Comparative Example—GR150F Poly(silsesquioxane) Resin

In a 200 ml flask, 10 g of BYK®-307 surfactant obtained from BK-Chemie was added to 90 g of ethanol and stirred for 1 hour at room temperature to prepare a 10 wt. % surfactant solution. In 100 ml flask, 0.5 g of tetramethylammonium nitrate (TMAN) catalyst was added to 24.5 g of deionized water and stirred for 1 hour at room temperature to prepare a 2 wt. % TMAN catalyst solution. In another 200 ml flask, 45.0 g of GR150F resin obtained from Techneglas of Perrysburg, Ohio was added to 55.0 g of PGMEA and stirred for 1 hour at room temperature to form a GR150F resin solution. GR150 is a poly(silsesquioxane) resin including equimolar amounts of poly(methylsilsesquioxane) blocks and poly(phenylsilsesquioxane) blocks with about 0.3 mole % of poly(dimethylsiloxane) blocks. In another 200 ml flask, 1.25 g of the 10 wt. % surfactant solution and 0.8 g of the TMAN catalyst solution were added to 100 g of the GR150F solution and stirred for 3 hours at room temperature to form a planarizing composition. The planarizing composition was filtered through a 0.1 micron filter.

The filtered planarizing composition was coated on a four-inch silicon wafer by spin coating at 1,500 revolutions per minute (RPM). The wafer with the cast film was baked on a series of two hot plates in air ambient for 60 seconds each, a first hot plate having a surface temperature of 160° C. and a second hot plate having a surface temperature of 180° C., to evaporate the solvents. The wafer with the baked coating was cured in a nitrogen ambient at 350° C. for 1 hour. The cured coating was inspected for cracking by optical microscopy and scanning electron microscopy. Severe cracking of the cured coating was observed.

Example 2

Comparative Example—Poly(silsesquioxane) Resin SST-3PM1

In a 200 ml flask, 45.0 g of SST-3PM1 resin obtained from Gelest Inc., Morrisville, Pa. was added to 55.0 g of PGMEA and stirred for 1 hour at room temperature to form an SST-3PM1 resin solution. SST-3PM1 is a polysilsesquioxane resin including 90 mole % poly(phenylsilsesquioxane) blocks and 10 mole % poly(methylsilsesquioxane) blocks. In another 200 ml flask, 1.25 g of the 10 wt. % surfactant solution prepared as described above and 0.8 g of the TMAN catalyst solution prepared as described above were added to 100 g of the SST-3PM1 resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. A thickness of the baked coating was measured and found to be 28,439 Å. The wafer with the baked coating was cured in a nitrogen ambient at 350° C. for 1 hour. The cured coating was inspected for cracking by optical microscopy and scanning electron microscopy. No cracking of the cured coating was observed.

Example 3

Dimethylsiloxane Copolymer Resin SST-3PM2

In a 200 ml flask, 45.0 g of SST-3PM2 resin obtained from Gelest Inc., Morrisville, Pa. was added to 55.0 g of PGMEA and stirred for 1 hour at room temperature to form an SST-3PM2 resin solution. SST-3PM2 is a dimethylsiloxane copolymer resin including 70 mole % poly(phenylsilsesquioxane) blocks and 30 mole % poly(dimethylsiloxane) copolymer blocks. In another 200 ml flask, 1.25 g of the 10 wt. % surfactant solution prepared as described above and 0.8 g of the TMAN catalyst solution prepared as described above were added to 100 g of the SST-3PM2 resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. The wafer with the baked coating was cured in a nitrogen ambient at 350° C. for 1 hour. The cured coating was inspected for cracking by optical microscopy and scanning electron microscopy. No cracking of the cured coating was observed.

Example 4

Dimethylsiloxane Copolymer Resin SST-3PM4

In a 200 ml flask, 45.0 g of SST-3PM4 resin obtained from Gelest Inc., Morrisville, Pa. was added to 55.0 g of PGMEA and stirred for 1 hour at room temperature to form an SST-3PM4 resin solution. SST-3PM4 is a dimethylsiloxane copolymer resin including 45 mole % poly(methylsilsesquioxane) blocks, 40 mole % poly(phenylsilsesquioxane) blocks, 15 mole % poly(phenylmethylsiloxane) blocks, and 10 mole % poly(diphenylsiloxane) blocks. In another 200 ml flask, 1.25 g of the 10 wt. % surfactant solution prepared as described above and 0.8 g of the TMAN catalyst solution prepared as described above were added to 100 g of the SST-3PM4 resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. A thickness of the baked coating was measured and found to be 32,556 Å. The wafer with the baked coating was cured in a nitrogen ambient at 350° C. for 1 hour. The cured coating was inspected for cracking by optical microscopy and scanning electron microscopy. No cracking of the cured coating was observed.

Example 5

Poly(silsesquioxane) Resin GR150F and Dimethylsiloxane Copolymer Resin SST-3PM2

In a 200 ml flask, 45.0 g of GR150F resin was added to 55.0 g of PGMEA and stirred for 1 hour at room temperature to form a GR150F resin solution. In another 200 ml flask, 45.0 g of SST-3PM2 resin was added to 55.0 g of PGMEA and stirred for 1 hour at room temperature to form an SST-3PM2 resin solution. In another 200 ml flask, 1.25 g of the 10 wt. % surfactant solution prepared as described above and 0.8 g of the TMAN catalyst solution prepared as described above were added to 95 g of the GR150F resin solution and 5 g of the SST-3PM2 resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. A thickness of the baked coating was measured and found to be 32,425 Å. The wafer with the baked coating was cured in a nitrogen ambient at 350° C. for 1 hour. The cured coating was inspected for cracking by optical microscopy and scanning electron microscopy. Cracking of the cured coating was observed. The cracking was to a lesser degree than the cracking observed in Comparative Example 1.

Example 6

Poly(silsesquioxane) Resin GR150F and Dimethylsiloxane Copolymer Resin SST-3PM2

In a 200 ml flask, 45.0 g of GR150F resin was added to 55.0 g of PGMEA and stirred for 1 hour at room temperature to form a GR150F resin solution. In another 200 ml flask, 45.0 g of SST-3PM2 resin was added to 55.0 g of PGMEA and stirred for 1 hour at room temperature to form an SST-3PM2 resin solution. In another 200 ml flask, 1.25 g of the 10 wt. % surfactant solution prepared as described above and 0.8 g of the TMAN catalyst solution prepared as described above were added to 75 g of the GR150F resin solution and 25 g of the SST-3PM2 resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. A thickness of the baked coating was measured and found to be 32,790 Å. The wafer with the baked coating was cured in a nitrogen ambient at 350° C. for 1 hour. The cured coating was inspected for cracking by optical microscopy and scanning electron microscopy. Cracking of the cured coating was observed. The cracking was to a lesser degree than the cracking observed in Comparative Example 1.

Example 7

Poly(silsequioxane) Resin SST-3PM1 and Dimethylsiloxane Copolymer Resin SST-3PM2

In a 200 ml flask, 30.0 g of SST-3PM1 resin was added to 70.0 g of PGMEA and stirred for 1 hour at room temperature to form an SST-3PM1 resin solution. In another 200 ml flask, 30.0 g of SST-3PM2 resin was added to 70.0 g of PGMEA and stirred for 1 hour at room temperature to form an SST-3PM2 resin solution. In another 200 ml flask, 1.25 g of the 10 wt. % surfactant solution prepared as described above and 0.8 g of the TMAN catalyst solution prepared as described above were added to 100 g of the SST-3PM1 resin solution and 1 g of the SST-3PM2 resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. A thickness of the baked coating was measured and found to be 12,942 Å. The wafer with the baked coating was cured in a nitrogen ambient at 350° C. for 1 hour. The cured coating was inspected for cracking by optical microscopy and scanning electron microscopy. No cracking of the cured coating was observed.

Example 8

Poly(silsesquioxane) Resin SST-3PM1 and Dimethylsiloxane Copolymer Resin SST-3PM4

In a 200 ml flask, 45.0 g of SST-3PM1 resin was added to 55.0 g of PGMEA and stirred for 1 hour at room temperature to form an SST-3PM1 resin solution. In another 200 ml flask, 45.0 g of SST-3PM4 resin was added to 55.0 g of PGMEA and stirred for 1 hour at room temperature to form an SST-3PM4 resin solution. In another 200 ml flask, 0.5 g of the 10 wt. % surfactant solution prepared as described above and 0.32 g of the TMAN catalyst solution prepared as described above were added to 10 g of the SST-3PM1 resin solution and 30 g of the SST-3PM4 resin solution and stirred for 3 hours at room temperature to form a planarizing composition. The planarizing composition was filtered through a 0.1 micron filter.

The filtered planarizing composition was coated on two, four-inch silicon wafers by spin coating at 1,500 RPM. The wafers with the cast film were baked on a series of two hot plates in air ambient for 60 seconds each, a first hot plate having a surface temperature of 160° C. and a second hot plate having a surface temperature of 180° C., to evaporate the solvents. A thickness of the baked coating was measured for each wafer and found to be 31,873 Å and 31,915 Å. One of the wafers was cured in a nitrogen ambient at 410° C. for 30 minutes and the other cured in a nitrogen ambient at 450° C. for 30 minutes. The cured coatings were inspected for cracking by optical microscopy and scanning electron microscopy. No cracking of the cured coating on either wafer was observed.

Example 9

Poly(silsesquioxane) Resin SST-3PM1 and Dimethylsiloxane Copolymer Resin SST-3PM4

In a 200 ml flask, 45.0 g of SST-3PM1 resin was added to 55.0 g of PGMEA and stirred for 1 hour at room temperature to form an SST-3PM1 resin solution. In another 200 ml flask, 45.0 g of SST-3PM4 resin was added to 55.0 g of PGMEA and stirred for 1 hour at room temperature to form an SST-3PM4 resin solution. In another 200 ml flask, 0.5 g of the 10 wt. % surfactant solution prepared as described above and 0.32 g of the TMAN catalyst solution prepared as described above were added to 20 g of the SST-3PM1 resin solution and 20 g of the SST-3PM4 resin solution and stirred for 3 hours at room temperature to form a planarizing composition. The planarizing composition was filtered through a 0.1 micron filter.

The filtered planarizing composition was coated on two, four-inch silicon wafers by spin coating at 1,500 RPM. The wafers with the cast film were baked on a series of two hot plates in air ambient for 60 seconds each, a first hot plate having a surface temperature of 160° C. and a second hot plate having a surface temperature of 180° C., to evaporate the solvents. A thickness of the baked coating was measured for each wafer and found to be 31,897 Å and 31,896 Å. One of the wafers was cured in a nitrogen ambient at 410° C. for 30 minutes and the other cured in a nitrogen ambient at 450° C. for 30 minutes. The cured coatings were inspected for cracking by optical microscopy and scanning electron microscopy. No cracking of the cured coating on either wafer was observed.

Example 10

Poly(silsesquioxane) Resin SST-3PM1 and Dimethylsiloxane Copolymer Resin SST-3PM4

In a 200 ml flask, 45.0 g of SST-3PM1 resin was added to 55.0 g of PGMEA and stirred for 1 hour at room temperature to form an SST-3PM1 resin solution. In another 200 ml flask, 45.0 g of SST-3PM4 resin was added to 55.0 g of PGMEA and stirred for 1 hour at room temperature to form an SST-3PM4 resin solution. In another 200 ml flask, 0.5 g of the 10 wt. % surfactant solution prepared as described above and 0.32 g of the TMAN catalyst solution prepared as described above were added to 30 g of the SST-3PM1 resin solution and 10 g of the SST-3PM4 resin solution and stirred for 3 hours at room temperature to form a planarizing composition. The planarizing composition was filtered through a 0.1 micron filter.

The filtered planarizing composition was coated on two, four-inch silicon wafers by spin coating at 1,500 RPM. The wafers with the cast film were baked on a series of two hot plates in air ambient for 60 seconds each, a first hot plate having a surface temperature of 160° C. and a second hot plate having a surface temperature of 180° C., to evaporate the solvents. A thickness of the baked coating was measured for each wafer and found to be 31,684 Å and 31,722 Å. One of the wafers was cured in a nitrogen ambient at 410° C. for 30 minutes and the other cured in a nitrogen ambient at 450° C. for 30 minutes. The cured coatings were inspected for cracking by optical microscopy and scanning electron microscopy. No cracking of the cured coating on either wafer was observed.

Example 11

Dimethylsiloxane Copolymer Resins SST-3PM2 and SST-3PM4

In a 200 ml flask, 30.0 g of SST-3PM4 resin was added to 70.0 g of PGMEA and stirred for 1 hour at room temperature to form an SST-3PM4 resin solution. In another 200 ml flask, 30.0 g of SST-3PM2 resin was added to 70.0 g of PGMEA and stirred for 1 hour at room temperature to form an SST-3PM2 resin solution. In another 200 ml flask, 1.25 g of the 10 wt. % surfactant solution prepared as described above and 0.8 g of the TMAN catalyst solution prepared as described above were added to 100 g of the SST-3PM4 resin solution and 1 g of the SST-3PM2 resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. A thickness of the baked coating was measured and found to be 14,231 Å. The wafer with the baked coating was cured in a nitrogen ambient at 350° C. for 1 hour. The cured coating was inspected for cracking by optical microscopy and scanning electron microscopy. No cracking of the cured coating was observed.

Example 12

Dimethylsiloxane Copolymer Resins SST-3PM2 and SST-3PM4

In a 200 ml flask, 45.0 g of SST-3PM4 resin was added to 55.0 g of PGMEA and stirred for 1 hour at room temperature to form an SST-3PM4 resin solution. In another 200 ml flask, 45.0 g of SST-3PM2 resin was added to 55.0 g of PGMEA and stirred for 1 hour at room temperature to form an SST-3PM2 resin solution. In another 200 ml flask, 1.25 g of the 10 wt. % surfactant solution prepared as described above and 0.8 g of the TMAN catalyst solution prepared as described above were added to 100 g of the SST-3PM4 resin solution and 1 g of the SST-3PM2 resin solution and stirred for 3 hours at room temperature to form a planarizing composition. The planarizing composition was filtered through a 0.1 micron filter.

The filtered planarizing composition was coated onto five, four-inch silicon wafers by spin coating, two at 1,000 RPM, two at 1,500 RPM, and one at 2,400 RPM. The wafers with the cast films were baked on a series of two hot plates in air ambient for 60 seconds each, a first hot plate having a surface temperature of 160° C. and a second hot plate having a surface temperature of 180° C., to evaporate the solvents. One of the two wafers coated at 1,000 RPM, one of the two wafers coated at 1,500 RPM, and the wafer coated at 2,400 RPM each received a second coating, each spun at same speed as for their first coating and baked again on the hot plates as described above. A thickness of the baked coating was measured for several of the wafers and found to be 43,458 Å for the single coating at 1,000 RPM, 93,494 Å for the double coating at 1,000 RPM, 32,440 Å for the single coating at 1,500 RPM, and 54,973 Å for the double coating at 2,400 RPM. The five wafers with the baked coatings were cured in a nitrogen ambient at 410° C. for 30 minutes. The cured coatings were inspected for cracking by optical microscopy and scanning electron microscopy. No cracking of the cured coatings was observed on the wafers with coating thicknesses up to 54,973 Å. Cracking was observed only on the wafer having a coating thickness of 93,494 Å.

Example 13

Dimethylsiloxane Copolymer Resins SST-3PM2 and SST-3PM4

In 100 ml flask, 0.5 g of tetrabutylammonium nitrate (TBAA) catalyst was added to 24.5 g of deionized water and stirred for 1 hour at room temperature to prepare a 2 wt. % TBAA catalyst solution. In a 200 ml flask, 45.0 g of SST-3PM4 resin was added to 55.0 g of PGMEA and stirred for 1 hour at room temperature to form an SST-3PM4 resin solution. In another 200 ml flask, 45.0 g of SST-3PM2 resin was added to 55.0 g of PGMEA and stirred for 1 hour at room temperature to form an SST-3PM2 resin solution. In another 200 ml flask, 0.675 g of the 10 wt. % surfactant solution prepared as described above, 0.4 g of the TBAA catalyst solution, and 0.025 g of trifluoroacetic acid were added to 50 g of the SST-3PM4 resin solution and 0.5 g of the SST-3PM2 resin solution and stirred for 3 hours at room temperature to form a planarizing composition. The planarizing composition was filtered through a 0.1 micron filter.

The filtered planarizing composition was coated onto three, four-inch silicon wafers by spin coating, one at 600 RPM, one at 1,000 RPM, and one at 1,500 RPM. The wafers with the cast films were baked on a series of two hot plates in air ambient for 60 seconds each, a first hot plate having a surface temperature of 160° C. and a second hot plate having a surface temperature of 180° C., to evaporate the solvents. A thickness of the baked coating was measured for the wafers and found to be 37,020 Å for the single coating at 1,500 RPM and 50,012 Å for the single coating at 1,000 RPM. The thickness for the single coating at 600 RPM could not be measured because the spin speed is too low to produce a uniform coating. The three wafers with the baked coatings were cured in a nitrogen ambient at 410° C. for 30 minutes. The cured coatings were inspected for cracking by optical microscopy and scanning electron microscopy. No cracking of the cured coatings was observed on the wafers coated at 1,500 RPM. Cracking was observed on the wafer coated at 1,000 RPM.

Example 14

Dimethylsiloxane Copolymer Resins SST-3PM2 and SST-3PM4

In a 200 ml flask, 45.0 g of SST-3PM4 resin was added to 55.0 g of PGMEA and stirred for 1 hour at room temperature to form an SST-3PM4 resin solution. In another 200 ml flask, 45.0 g of SST-3PM2 resin was added to 55.0 g of PGMEA and stirred for 1 hour at room temperature to form an SST-3PM2 resin solution. In another 200 ml flask, 1.25 g of the 10 wt. % surfactant solution prepared as described above, 0.8 g of the TMAN catalyst solution prepared as described above, and 0.45 g of a cross-linker were added to 100 g of the SST-3PM4 resin solution and 1 g of the SST-3PM2 resin solution and stirred for 3 hours at room temperature to form a planarizing composition. The cross-linker was Silquest® A-1170 (bis-(trimethoxysilylpropyl) amine) obtained from Momentive Performance Materials, Waterford, N.Y. The planarizing composition was filtered through a 0.1 micron filter.

The filtered planarizing composition was coated onto twelve, four-inch silicon wafers by spin coating, three at 1,000 RPM, three at 1,300 RPM, three at 1,800 RPM, and three at 2,400 RPM. The wafers with the cast films were baked on a series of two hot plates in air ambient for 60 seconds each, a first hot plate having a surface temperature of 160° C. and a second hot plate having a surface temperature of 180° C., to evaporate the solvents. Each of the wafers received a second coating, each spun at same speed as for their first coating and baked again on the hot plates as described above. A thickness of the baked coating was measured for each of the wafers. The twelve wafers were cured in a nitrogen ambient for 30 minutes. Four of the twelve wafers, one of each of the wafers coated at the four spin speeds, were cured at 360° C. Another four of the twelve wafers, one of each of the wafers coated at the four spin speeds, were cured at 380° C. The remaining four of the twelve wafers, one of each of the wafers coated at the four spin speeds, were cured at 410° C. The cured coatings were inspected for cracking by optical microscopy and scanning electron microscopy. The thicknesses and cracking inspection results are shown in Table 1 below. As shown in Table 1, no cracking of the cured coatings was observed on wafers with coating thicknesses exceeding 10 microns (100,000 Å) at temperatures as high as 380° C. No cracking of the cured coatings was observed on wafers with coating thicknesses exceeding 7 microns (77,679 Å) at temperatures as high as 410° C.

TABLE 1

| Spin Speed (RPM) | Film Thickness Post Bake (Å) | Cure Temp (° C.) | Visual Inspection Results |
|---|---|---|---|
| 2,600 | 52,067 | 360 | No cracking |
| 1,800 | 63,590 | 360 | No cracking |
| 1,300 | 77,679 | 360 | No cracking |
| 1,000 | >100,000 | 360 | No cracking |
| 2,600 | 53,625 | 380 | No cracking |
| 1,800 | 63,178 | 380 | No cracking |
| 1,300 | 77,234 | 380 | No cracking |
| 1,000 | >100,000 | 380 | No cracking |
| 2,600 | 51,563 | 410 | No cracking |
| 1,800 | 62,537 | 410 | No cracking |
| 1,300 | 74,423 | 410 | No cracking |
| 1,000 | >100,000 | 410 | Cracking |

Example 15

Dimethylsiloxane Copolymer Resins SST-3PM2 and SST-3PM4

In a 200 ml flask, 45.0 g of SST-3PM4 resin was added to 55.0 g of PGMEA and stirred for 1 hour at room temperature to form an SST-3PM4 resin solution. In another 200 ml flask, 45.0 g of SST-3PM2 resin was added to 55.0 g of PGMEA and stirred for 1 hour at room temperature to form an SST-3PM2 resin solution. In another 200 ml flask, 1.25 g of the 10 wt. % surfactant solution prepared as described above, 0.8 g of the TMAN catalyst solution prepared as described above, and 0.45 g of (bis-(trimethoxysilylpropyl) amine cross-linker described above were added to 100 g of the SST-3PM4 resin solution and 1 g of the SST-3PM2 resin solution and stirred for 3 hours at room temperature to form a planarizing composition. The planarizing composition was filtered through a 0.1 micron filter.

The filtered planarizing composition was coated on a four-inch silicon wafer by spin coating at 1,500 RPM. The wafer with the cast film was baked on a series of two hot plates in air ambient for 60 seconds each, a first hot plate having a surface temperature of 160° C. and a second hot plate having a surface temperature of 180° C., to evaporate the solvents. The wafer with the baked coating was cured in a nitrogen ambient at 410° C. for 30 minutes.

Figure 3:
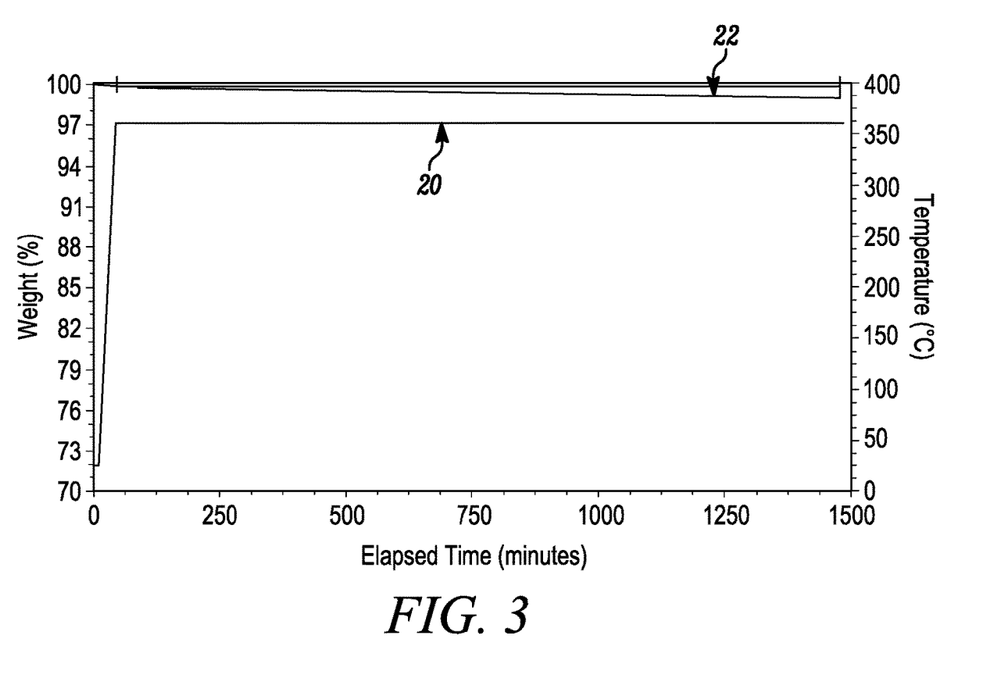
FIG. 3 is related to Example 15 below and shows the thermal gravimetric analysis results for a planarizing film according to embodiments of this disclosure.

The cured coating was collected from the wafer and subjected to TGA analysis on a Discovery TGA System. The sample was heated in $N_2$ from room temperature (25° C.) to about 360° C. and held for 24 hours. The results are presented in FIG. 3. FIG. 3 illustrates a temperature profile 20 of the TGA (in reference to the right-hand axis) and a weight 22 of the coating as a percentage of the initial coating weight (in reference to the left-hand axis). As shown in FIG. 3, the coating is thermally stable, losing less than 1% weight after heating at 360° C. for 24 hours.

In a 100 ml flask, 20.0 g of the planarizing composition was added to 25.0 g of PGMEA, and stirred for 1 hour at room temperature to form a diluted planarizing composition. The diluted planarizing composition was filtered through a 0.1 micron filter.

The filtered diluted planarizing composition was coated on an 8-inch silicon wafer and on a 2-inch by 2-inch transparent glass substrate by spin coating at 1,500 RPM. The silicon wafer and glass substrate with the cast films were baked on a series of two hot plates in air ambient for 60 seconds each, a first hot plate having a surface temperature of 160° C. and a second hot plate having a surface temperature of 180° C., to evaporate the solvents. The wafers with the baked coatings were cured in an air ambient at 250° C. for 60 minutes.

Transmittance of the glass and coated glass was measured on a Hitachi U-3900 UV-Vis spectrophotometer. An optical transmittance of 92.1% was measured for the glass substrate with no coating, and an optical transmittance of 91.6% was measured for the cured coating on the glass substrate, showing high transparency for the cured coating.

The 8-inch silicon wafer with the cured coating was measured for nanohardness and reduced elastic modulus analysis by a nanoindentation test on a Hysitron® Nanomechanical Test System. A high nanohardness of 145.1 Mpa and a reduced elastic modulus of 3.49 GPa were measured for the cured coating on the silicon wafer.

What is claimed is:

1. A composition for planarizing a surface of a semiconductor device, the composition comprising:
   a catalyst;
   at least one solvent, the at least one solvent including at least one of: ethyl lactate, propylene glycol propyl ether, propylene glycol monomethyl ether acetate, ethanol, isopropyl alcohol, and n-butyl acetate; and
   at least one polysiloxane resin including polysilsesquioxane blocks and polysiloxane blocks, the polysiloxane blocks according to the general formula:

wherein $R_1$, $R_2$ are each independently selected from the group consisting of: an aryl group or an alkyl group, with substituted or unsubstituted carbons, wherein a concentration of the polysiloxane blocks is from 0.1 mole percent to 35 mole percent of the polysiloxane resin.

2. The composition of claim 1, wherein the polysiloxane blocks include at least one of: poly(diphenylsiloxane) blocks, poly(phenylmethylsiloxane) blocks, and poly(dimethylsiloxane) blocks.

3. The composition of claim 2, wherein the polysiloxane blocks consist of poly(diphenylsiloxane) blocks and poly(phenylmethylsiloxane) blocks.

4. The composition of claim 2, wherein the polysiloxane blocks consist of poly(dimethylsiloxane) blocks.

5. The composition of claim 1, wherein the polysilsesquioxane blocks include at least one of: poly(methylsilsesquioxane) blocks and poly(phenylsilsesquioxane) blocks.

6. The composition of claim 1, wherein a weight average molecular weight of the polysiloxane blocks in the composition is from 100 Da to 5,000 Da.

7. The composition of claim 1, wherein the catalyst includes at least one of:
tetramethylammonium acetate, tetramethylammonium hydroxide, tetrabutylammonium acetate, cetyltrimethylammonium acetate, and tetramethylammonium nitrate.

8. The composition of claim 1, further including a surfactant.

9. The composition of claim 1, further including a cross-linker.

10. The composition of claim 1, wherein the at least one polysiloxane resin includes a first polysiloxane resin and a second polysiloxane resin.

11. The composition of claim 1, wherein the at least one polysiloxane resin is a first polysiloxane resin, and further including a second polysiloxane resin, the second polysiloxane resin consisting of a poly(silsesquioxane) resin.

12. A method for making a planarizing composition, the method comprising:
dissolving at least one polysiloxane resin in one or more solvents to form a resin solution, the at least one polysiloxane resin including polysilsesquioxane blocks and polysiloxane blocks, the polysiloxane blocks according to the general formula:

wherein $R_1$, $R_2$ are each independently selected from the group consisting of: an aryl group or an alkyl group, with substituted or unsubstituted carbons, wherein a concentration of the polysiloxane blocks is from 0.1 mole percent to 35 mole percent of the polysiloxane resin; and adding a catalyst to the resin solution, wherein the one or more solvents includes at least one of: ethyl lactate, propylene glycol propyl ether, propylene glycol monomethyl ether acetate, ethanol, isopropyl alcohol, and n-butyl acetate.

13. The method of claim 12, wherein the polysiloxane blocks include at least one of: poly(diphenylsiloxane) blocks, poly(phenylmethylsiloxane) blocks, and poly(dimethylsiloxane) blocks.

* * * * *